United States Patent [19]
Atsumi

[11] Patent Number: 5,544,014
[45] Date of Patent: Aug. 6, 1996

[54] IC CARD HAVING A BUILT-IN SEMICONDUCTOR INTEGRATED CIRCUIT DEVICE

[75] Inventor: Shiro Atsumi, Tokyo, Japan

[73] Assignee: Oki Electric Industry Co., Ltd., Tokyo, Japan

[21] Appl. No.: 211,570

[22] PCT Filed: Jul. 27, 1993

[86] PCT No.: PCT/JP93/01055

§ 371 Date: Apr. 8, 1994

§ 102(e) Date: Apr. 8, 1994

[87] PCT Pub. No.: WO94/04376

PCT Pub. Date: Mar. 3, 1994

[30] Foreign Application Priority Data

Aug. 12, 1992 [JP] Japan ................................. 4-215100

[51] Int. Cl.⁶ .................................................. H05K 1/14
[52] U.S. Cl. ......................... 361/737; 361/736; 361/752; 361/728; 174/35 R; 174/52.2; 257/679
[58] Field of Search ................................. 361/737, 752, 361/796, 799, 728, 736; 257/679, 676, 659, 787; 174/35 R, 52.2, 52.3

[56] References Cited

U.S. PATENT DOCUMENTS 4,417,413 11/1983 Hoppe et al. .
4,603,249 7/1986 Hoppe et al. .

FOREIGN PATENT DOCUMENTS

| 0456323 | 11/1991 | European Pat. Off. . |
| 58-125892 | 7/1983 | Japan . |
| 9228743 | 12/1984 | Japan .................................. 257/679 |
| 63-84989 | 4/1988 | Japan . |
| 63-233892 | 9/1988 | Japan . |
| 2081644 | 2/1982 | United Kingdom . |
| 2095175 | 9/1982 | United Kingdom . |
| 2204182 | 11/1988 | United Kingdom . |

Primary Examiner—Leo P. Picard
Assistant Examiner—Y. Whang
Attorney, Agent, or Firm—Spencer & Frank

[57] ABSTRACT

A first aspect of the present invention comprises a card substrate having a front surface and a reverse surface, a magnetic stripe provided on the reverse surface for storing information therein, a module provided on a given region of the front surface with a built-in semiconductor integrated circuit device provided with ready access terminals for connecting to an external device, wherein an end portion of the module is positioned perpendicular to the magnetic stripe. With such an arrangement of the IC card, deformation in thickness of the card substrate is reduced at the portion adjacent to the upper portion of the module, and hence stress to be applied to this portion is relaxed. Furthermore, according to a second aspect of the present invention, the thickness of an end portion is gradually thinned so that deformation in thickness of the card substrate is further reduced at the portion adjacent to the upper portion of the module, and hence the stress to be applied to this portion is further relaxed. Still furthermore, according to a third aspect of the invention, since a part of the end portion is structured to have a tip end portion and the module is disposed in the manner that an end portion of the end portion is point-shaped, deformation in thickness of the card substrate is reduced at the portion adjacent to the upper portion of the module, and hence the stress to be applied to this portion is relaxed. Accordingly, it is possible to provide an IC card having high durability.

8 Claims, 8 Drawing Sheets

F I G. 1
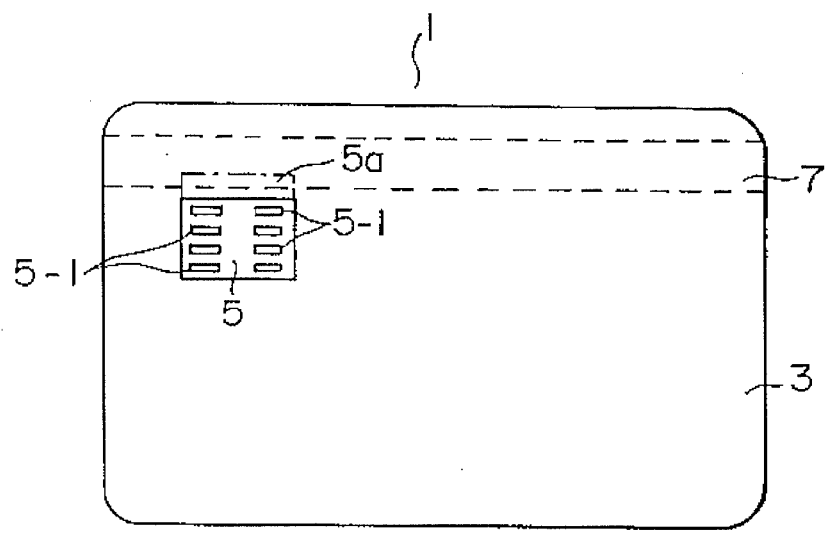
F I G. 2
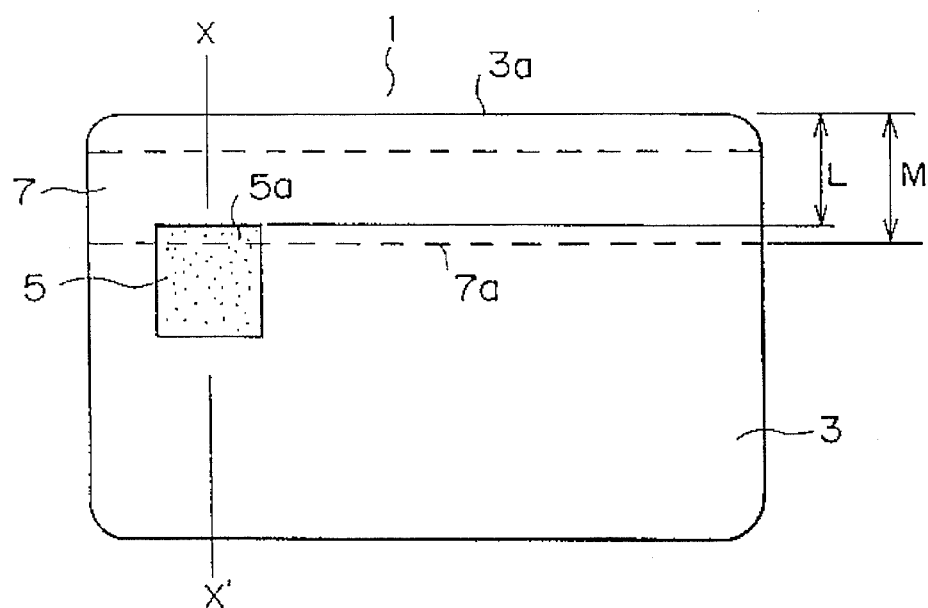

IC CARD HAVING A BUILT-IN SEMICONDUCTOR INTEGRATED CIRCUIT DEVICE

TECHNICAL FIELD

The present invention relates to an IC card with a built-in semiconductor integrated circuit device, particularly to a structure of an IC card having a front surface on which ready access terminals are provided for connecting to an external device and a reverse surface on which a magnetic body line (magnetic stripe) is provided for storing information therein.

BACKGROUND TECHNOLOGY

An IC card comprises a central processing unit (CPU) and a memory circuit which are respectively built in a card. That is, the IC card is a kind of computer. Accordingly, the IC card can be applied to a variety of purposes.

To make the IC card generalized, the standardization of the IC card is now under progress internationally according to a standard of an International Organization for Standardization (hereinafter referred to as an ISO) and in Japan according to a standard of a Japanese Industrial Standard (hereinafter referred to as a JIS).

For example, according to ISO7816-1, ISO7816-2 (corresponding to JISX6303), a distance A ranging from an upper end 101 of an IC card 100 to an upper side of ready access terminals 103-1, 103-2 (a side nearest to the upper end 101 among sides defining terminals) of an IC chip module 103 is set to be 19.23 mm in maximum, as illustrated in FIG. 15.

According to an ISO7811-5 (corresponding to JISX6302), a distance B ranging from the upper end 101 of the IC card 100 to a base of a third track 105a of a magnetic stripe 105 is prescribed to be 15.32 mm at minimum, and 15.82 mm at maximum as illustrated in FIG. 16.

FIG. 17 is an enlarged cross-sectional view of a main portion of the IC card provided with a magnetic stripe which meets the standard as set forth above (which is a so-called JIS-I type IC card in Japan). A positional relation between the IC chip module 103 and the magnetic stripe 105 can be easily understood from FIG. 17.

In this case, a distance C ranging from the upper end 101 of the IC card to a base of the magnetic stripe 105 comes to 16.82 mm which is the sum of the distance B ranging from the upper end 101 to the base of the third track 105a, i.e. 15.82 mm in maximum and a 1 mm margin for covering errors. Since the distance A ranging from the upper end 101 to the upper sides of the ready access terminals 103-1,103-2 is 19.23 mm in maximum, a distance D ranging from the upper end 101 to the upper side of the IC chip module 103 comes to 18.23 mm which is the difference between the distance A and a 1 mm margin to be involved in manufacturing the module.

Accordingly, a gap E (=D–C), i.e. between the base of the magnetic stripe 105 and the upper side of the IC chip module 103 comes to 1.41 mm.

If stress is applied to the IC card to bend the IC card in a direction of a short side thereof as illustrated in FIG. 18, the stress is concentrated to the portion adjacent to the gap E, particularly to the portion adjacent to the upper side of the IC chip module 103 since deformation in thickness of the card substrate is sharp at the portion adjacent to the gap E.

It is an object of the invention to provide an IC card capable of relaxing stress and enhancing durability compared with the prior art IC card.

DISCLOSURE OF THE INVENTION

An IC card according to a first aspect of the invention comprises a card substrate having front and reverse surfaces, a magnetic stripe formed on the reverse surface for storing information therein and a module which is formed on a given region of the front surface and includes a semiconductor integrated circuit device therein provided with ready access terminals for connecting with an external device, wherein an end portion of the module is positioned perpendicular to the magnetic stripe.

An IC card according to a second aspect of the invention is structured in that the thickness of the end portion of the module is gradually thinned.

An IC card according to a third aspect of the invention is structured in that a part of the end portion of the module is point-shaped. More in detail, the module is formed pentagonal or hexagonal and is arranged in a manner that a tip end of the end portion of the module is point-shaped.

BRIEF DESCRIPTION OF THE DRAWINGS

FIG. 1 is a plan view showing an external appearance of an IC card according to a first embodiment of the present invention, FIG. 2 is a plan view of the IC card according to the first embodiment of the present invention.

BEST MODE FOR CARRYING OUT THE INVENTION

Figure 3:
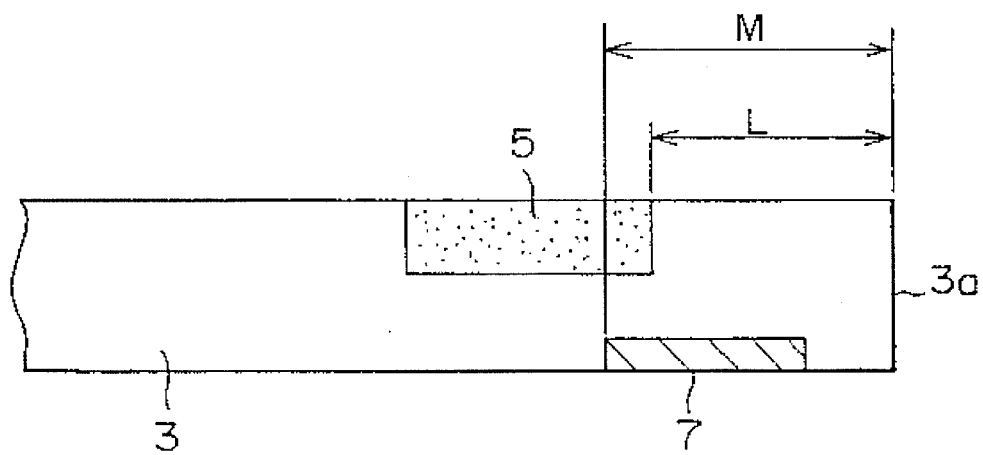
FIG. 3 is a cross-sectional view of a main portion of the IC card of FIG. 2.
Figure 4:
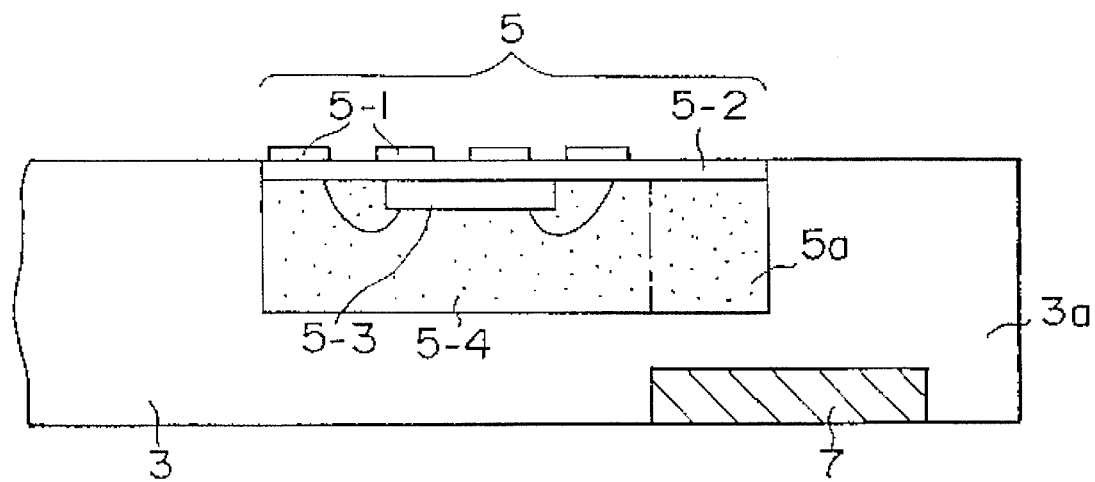
FIG. 4 is an enlarged cross-sectional view explaining in detail the cross-sectional view of the main portion of FIG. 3.

An optimum embodiment of the present invention will be described with reference to attached drawings.

First, a first embodiment of the present invention will be described with reference to FIGS. 1 to 4.

FIG. 1 is a plan view of an IC card according to the present embodiment. This plan view is typically illustrated for explaining the present invention.

An IC card 1 which is the same as a general IC card in that it comprises an IC chip module 5 (hereinafter referred to as a module) which is provided on the front surface of an IC card substrate 3 and includes a semiconductor circuit device therein provided with a plurality of reads access terminals 5-1 for connecting to an external device and a magnetic stripe 7 (i.e., magnetic body) which is provided on a reverse (back) surface of the card substrate 3 for storing information therein.

A feature of the present invention resides in that an end (side) 5a of the module 5 (denoted at one dotted chain line in FIG. 1) is positioned to extend to an upper portion of the magnetic stripe 7 provided on the reverse surface of the card substrate 3.

This is explained with reference to FIG. 2. FIG. 2 schematically shows the IC card of FIG. 1. The IC card 1 has a distance L ranging from an upper end (long side) 3a of the card substrate 3 to an upper end of the module 5. Distance L is set to be smaller than a distance M ranging from the upper end 3a of the card substrate 3 to a base (end face) 7a of the magnetic stripe 7. That is, the module 5 is structured and disposed in the manner that the gap between the module and the magnetic stripe (=L–M) is set to be a negative value.

A cross-sectional view of a main portion of the IC card as taken along X–X' of FIG. 2 is illustrated in FIG. 3 so that the positional relation between the module 5 and the magnetic stripe 7 is easily understood.

As shown in FIG. 3, the IC card of the present embodiment has the module end portion of which is positioned to extend to the upper portion of the magnetic stripe 7. That is, as mentioned above, the module 5 is disposed so that the distance L is less than the distance M.

The module 5 comprises a substrate 5-2, a semiconductor circuit device 5-3 mounted on one surface of the substrate 5-2, a mold resin 5-4 for covering the substrate 5-2 and the semiconductor circuit device 5-3 and ready access terminals 5-1 provided on the other surface of the substrate 5-2 to connect to an external device (not shown). The module is generally accommodated in a module accommodation portion which is a so-called spot facing defined on the front surface of the card substrate and its neighboring portion. Likewise, the magnetic stripe 7 is also accommodated in the so-called spot facing defined on the reverse surface of the card substrate and its neighboring portion.

Although the structure per se of the module of the present invention is the same as that of the general IC card, the overall structure of the module is different from that of the general IC card in that the end portion 5a of the module of the present invention is positioned to extend to the upper portion of the magnetic stripe and this is the feature of the present invention.

With such an arrangement, since deformation in thickness of the card substrate becomes gentle at the portion adjacent to the gap between the module and the magnetic stripe, the stress to be applied to this portion is relaxed.

A second embodiment of the present invention will be described with reference to FIGS. 5 to 9. In this embodiment, components which are the same as those explained in the first embodiment are denoted at the same numerals and explanation thereof is omitted.

Figure 5:
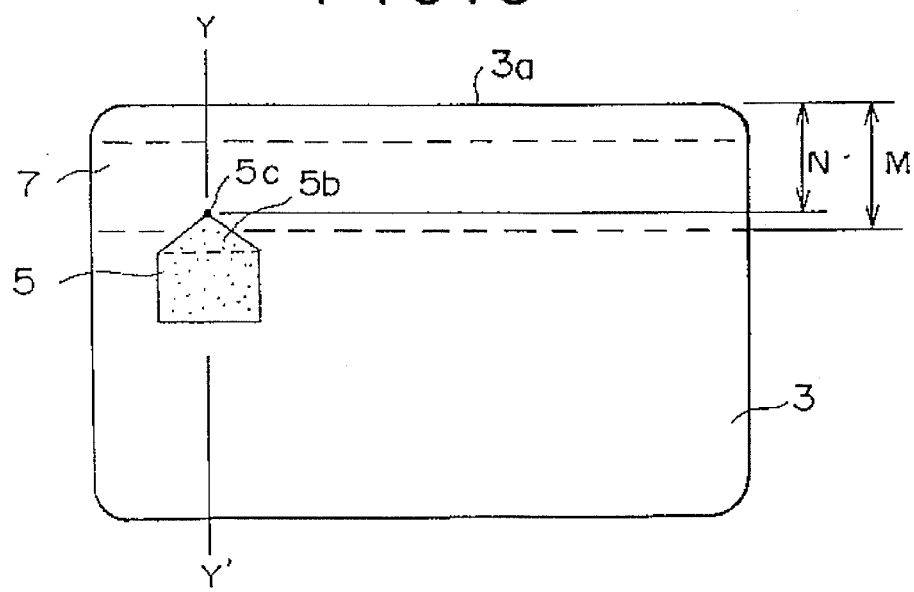
FIG. 5 is a plan view of an IC card according to a second embodiment of the present invention.
Figure 6:
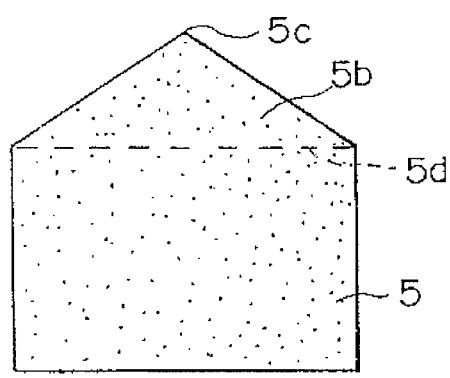
FIG. 6 is a plan view of an IC chip module according to the second embodiment.
Figure 7:
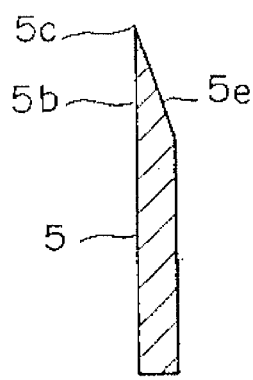
FIG. 7 is a cross-sectional view of the IC chip module of FIG. 6.

FIG. 5 is a plan view of an IC card typically illustrating the present embodiment. The IC card in this embodiment has a point-shaped portion 5b which is formed as illustrated in FIG. 6 at the end portion 5a of the module 5 of the IC card in the first embodiment and the thickness of the end portion 5b is gradually thinned toward a tip end 5c as illustrated in FIG. 7. As is easily understood from FIGS. 6 and 7, the module is pentagonal in plan view and the thickness of the module 5 is gradually thinned from a base 5d of the end portion 5b toward the tip end 5c. That is, the end portion 5b has a tapered portion 5e. It is a matter of course that in this IC card, a distance N ranging from the upper end 3a of the IC card substrate 3 to the upper end, i.e., tip end 5c of the module 5 is formed to be less than a distance M ranging from the upper end 3a to a base 7a of the magnetic stripe 7.

Figure 8:
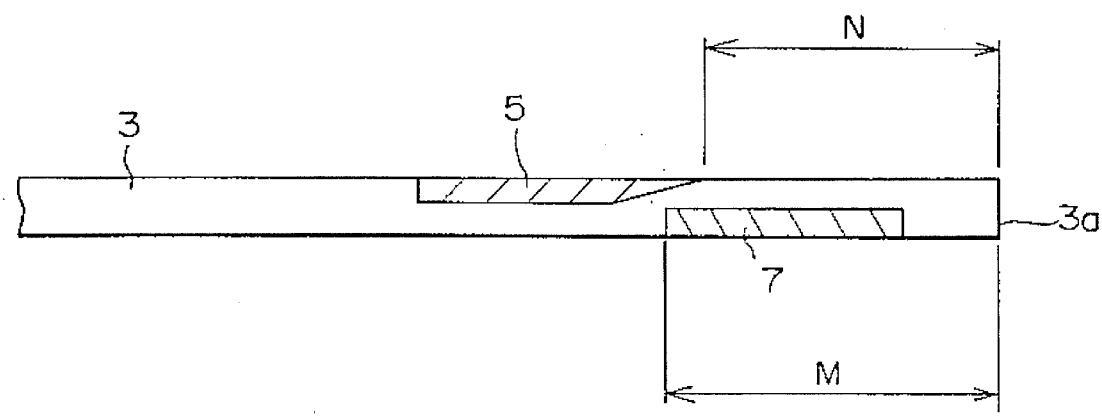
FIG. 8 is a cross-sectional view of a main portion of the IC card for explaining the positional relation between the IC chip module and a magnetic stripe according to the second embodiment.

A cross-sectional view of the main portion taken along Y–Y' of FIG. 5 is illustrated in FIG. 8 so that the positional relation between the module 5 and the magnetic stripe 7 is easily understood.

As illustrated in FIG. 8, the IC card of the present embodiment has the module 5 end portion of which is positioned to extend to the upper portion of the magnetic stripe 7 and the thickness of the end portion is gradually thinned.

Figure 9:
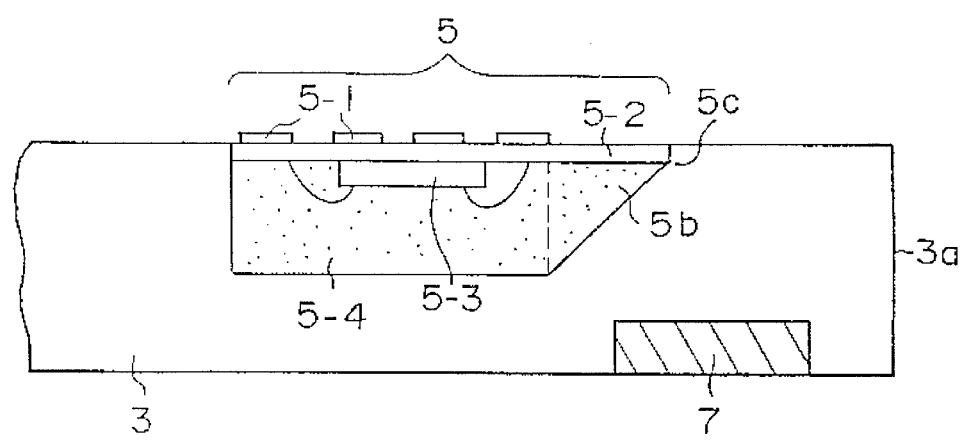
FIG. 9 is an enlarged cross-sectional view for explaining in detail the cross-sectional view of the main portion of FIG. 8, FIG. 10 a plan view of an IC card according to a third embodiment of the present invention.

A portion which enlarges and describes the module 5 in detail is illustrated in FIG. 9. As is evident from FIG. 9, the end portion 5b of the module 5 is formed to be gradually thinned in its thickness toward the tip end 5c thereof.

According to the second embodiment as described above, since deformation in thickness of the card substrate is gentler at the portion adjacent to the gap between the module and the magnetic stripe than that of the first embodiment, the stress to be applied to this portion is more relaxed.

A third embodiment of the present invention will be described with reference to FIGS. 10 to 14. In this embodiment, components which are the same as those explained in the first and second embodiments are denoted at the same numerals and explanation thereof is omitted.

Figure 10:
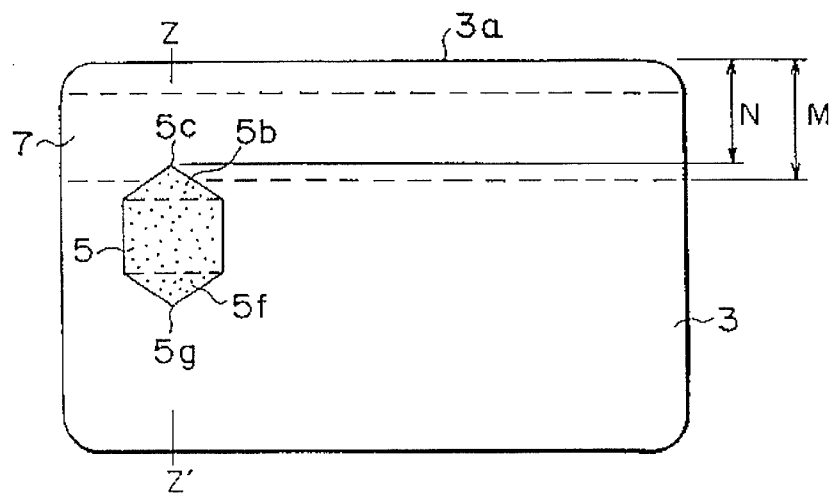

FIG. 10 is a plan view of an IC card typically illustrating the present embodiment.

FIG. 10 a is plan view of the IC card typically illustrating the present embodiment. The IC card in this embodiment further includes an end portion 5f at the portion opposite to the end portion 5b of the module 5 in the second embodiment. In the first and second embodiments, there is a "gap" portion alone where the stress for bending the IC card in the direction of the short sides thereof is most concentrated. According to this embodiment, there is a lower portion of the module 5 where such a stress is secondly concentrated to obtain the IC card having enhanced durability.

Figure 11:
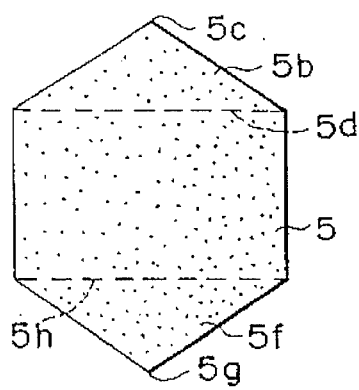
FIG. 11 is a plan view of an IC chip module according the a third embodiment.
Figure 12:
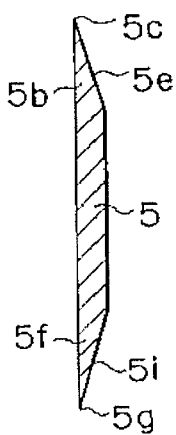
FIG. 12 is a cross-sectional view of the IC chip module of FIG. 11.

The end portion 5f has the same shape as the end portion 5b. That is, the end portion 5f is formed symmetrically in its shape with the end portion 5b as illustrated in FIG. 11. Further, the end portion 5f is gradually thinned in its thickness toward a tip end 5g thereof as illustrated in FIG. 12. As is easily understood from FIGS. 11 and 12, the module 5 is hexagonal in plan view and the thickness of the end portion 5f is gradually thinned in its thickness from the base 5h thereof toward the tip end 5g. That is, the end portion 5f has a tapered portion 5i. It is a matter of course that in this IC card, the distance N ranging from the upper end 3a of the card substrate 3 to the upper end, i.e., tip end 5c of the module 5 is formed to be less than the distance M ranging from the upper end 3a to the base 7a of the magnetic stripe 7.

Figure 13:
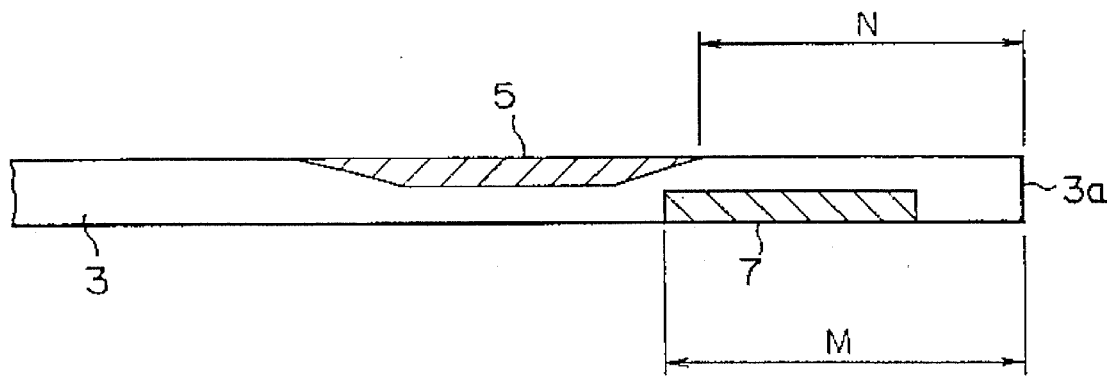
FIG. 13 is a cross-sectional view of a main portion of the IC card for explaining the positional relation between the IC chip module and a magnetic stripe according to the third embodiment.

A cross-sectional view of the main portion taken along Z–Z' of FIG. 10 is illustrated in FIG. 13 so that the positional relation between the module 5 and the magnetic stripe 7 is easily understood.

In the IC card of the present embodiment as illustrated in FIG. 13, the end portion of the module 5 is positioned to extend to the upper portion of the magnetic stripe 7 and the thickness thereof is gradually thinned and an end portion opposite to this end portion is formed symmetrically in its shape with this end portion.

Figure 14:
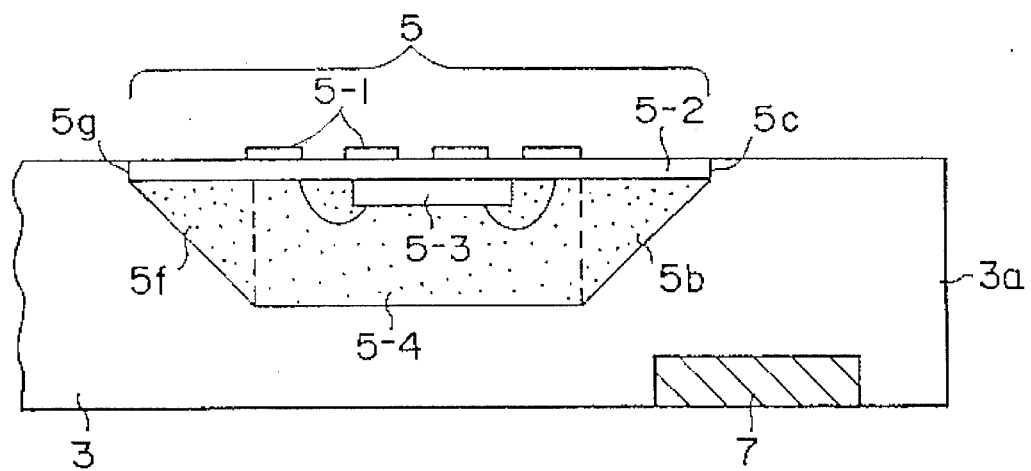
FIG. 14 is an enlarged cross-sectional view for explaining in detail the cross-sectional view of the main portion of FIG. 13.
Figure 15:
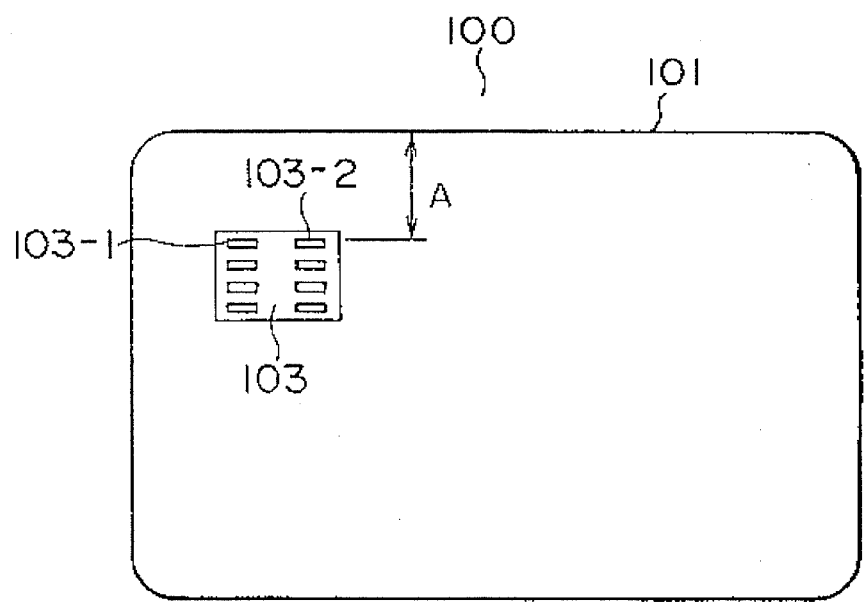
FIG. 15 is a plan view showing an external appearance of a front surface of a general IC card.
Figure 16:
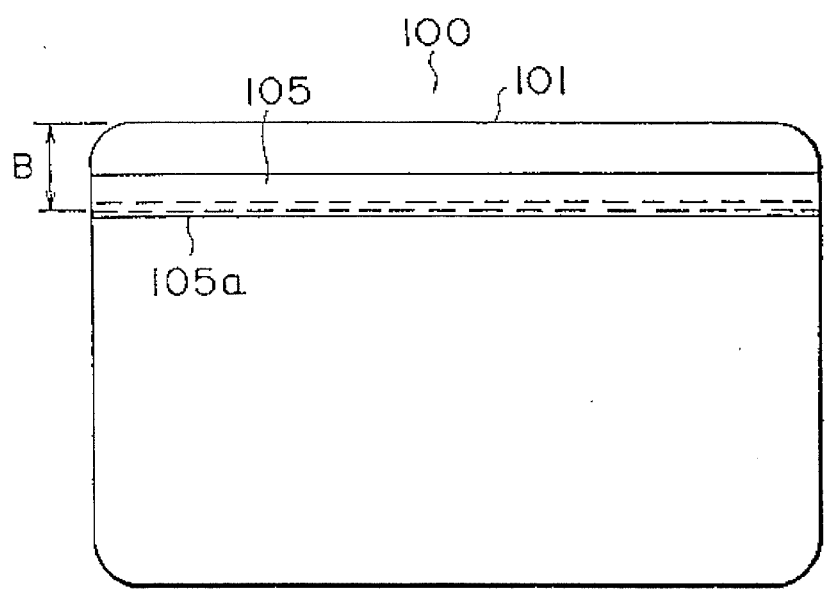
FIG. 16 is a plan view showing an external appearance of a reverse surface of the IC card of FIG. 15.
Figure 17:
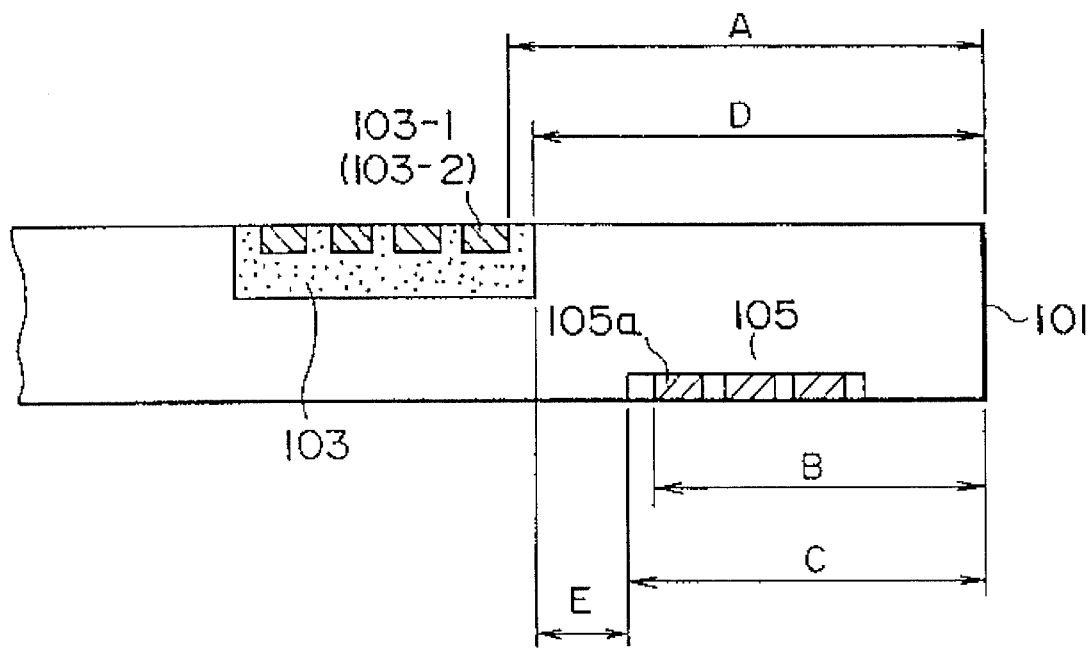
FIG. 17 is a cross-sectional view of a main portion of the IC card of FIG. 15
Figure 18:
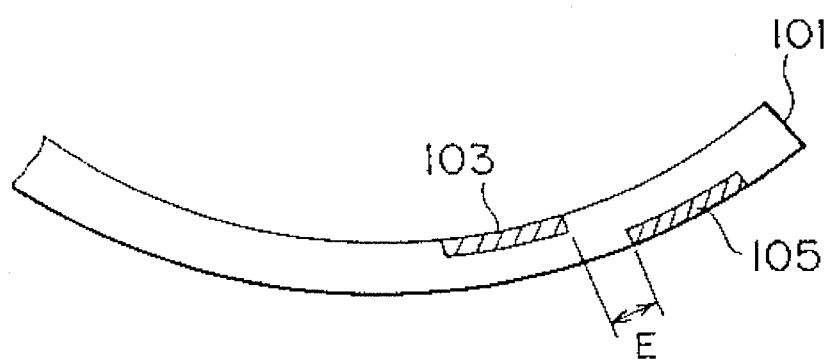
FIG. 18 is a cross-sectional view for explaining the state where stress is applied to the IC card of FIG. 15.

A portion which enlarges and explains the module 5 in detail is illustrated in FIG. 14. As is evident from FIG. 14, the end portion 5f of the nodule 5 is formed to be gradually thinned in its thickness toward the tip end 5g like the end portion 5b.

According to the aforementioned third embodiment, since deformation in thickness of the card substrate is gentle at the portion adjacent to the gap between the module and the magnetic stripe, the stress to be applied to this portion is relaxed, and further the stress is likewise relaxed at the portion where the stress is secondly concentrated.

According to the present invention as explained above, even if the stress for bending the IC card in the direction of short sides thereof is applied to the IC card, the stress can be relaxed, which leads to the provision of the IC card having high durability.

INDUSTRIAL UTILIZATION

The present invention can be applied to an IC card with a built-in semiconductor integrated circuit device, particularly to an IC card including ready access terminals provided on the front surface thereof for connecting to an external device and a magnetic body line (magnetic stripe) provided on the reverse surface thereof for storing information therein.

According to the first aspect of the invention, since the end portion of the module is disposed to extend to the upper portion of the magnetic stripe, deformation in thickness of the card substrate is reduced at the portion adjacent to the upper portion of the module so that the stress to be applied thereto is relaxed.

Furthermore, according to the second aspect of the invention, since the module is structured in that the thickness of the end portion thereof is gradually thinned, deformation in thickness of the card substrate is further reduced at the portion adjacent to the upper portion of the module so that the stress to be applied thereto is more relaxed.

Still furthermore, according to the third aspect of the invention, since the module is structured in that a part of the end portion thereof has a point-shaped portion, more in detail, the module is formed pentagonal or hexagonal and it is disposed in the manner that the tip end of the end portion is point-shaped, deformation in thickness of the card substrate is reduced at the portion adjacent to the upper portion of the module so that the stress to be applied thereto is relaxed.

If the first, second and third embodiments of the present invention are applied to the lower portion of the module, in addition to the upper portion of the module of the IC card, the stress can be relaxed at the portion where it is most concentratedly applied in the direction of the short sides of the IC card and at the portion where it is secondly concentratedly applied to the lower portion of the module 5. As a result, it is possible to provide an IC card having high durability.

I claim:

1. An IC card comprising;

a card substrate defined by a first long side, a first short side which is substantially perpendicular to said first long side, a second long side opposite to said first long side, and a second short side opposite to said first short side, said card substrate having a front surface, and a back surface opposite to said front surface;

a magnetic body having a first end face and a second end face opposite to said first end face, said magnetic body storing information therein and being formed on said front surface of said card substrate, said first end face of said magnetic body being substantially parallel with said first long side of said card substrate, and being spaced from said first long side of said card substrate by a first distance, and said second end face of said magnetic body being spaced from said first long side of said card substrate by a second distance which is longer than said first distance; and a module formed on said back surface of said card substrate, said module including a substrate having a first side and a second side opposite to said first side of said module substrate, a semiconductor integrated circuit device disposed on said substrate, and a covering material covering said substrate and said semiconductor integrated circuit device, said first side of said module substrate being spaced from said first long side of said card substrate by a third distance which is longer than said first distance and shorter than said second distance.

2. An IC card according to claim 1, wherein an end portion of said first side of said module is gradually thinned in its thickness toward said first long side of said card substrate.

3. An IC card according to claim 2, wherein said end portion of said first side of said module has a point-shaped portion.

4. An IC card according to claim 2, wherein an end portion of said second side of said module is gradually thinned in its thickness toward said second long side of said card substrate.

5. An IC card according to claim 4 wherein said end portion of said second side of said module has a point-shaped portion.

6. An IC card according to claim 1, wherein an end portion of the first side of said module is positioned perpendicular to said magnetic body.

7. An IC card according to claim 1, wherein said semiconductor integrated circuit device includes ready access terminals for connection with an external device.

8. An IC card according to claim 1, wherein the first side of said module is superposed to said magnetic body.

* * * * *